United States Patent [19]
Sakaguchi

[11] Patent Number: 6,088,913
[45] Date of Patent: Jul. 18, 2000

[54] APPARATUS FOR AND METHOD OF MOUNTING ELECTRONIC PARTS

[75] Inventor: Shinsuke Sakaguchi, Fukuoka, Japan

[73] Assignee: Matsushita Electric Industrial Co., Ltd., Osaka, Japan

[21] Appl. No.: 09/150,919

[22] Filed: Sep. 10, 1998

[30] Foreign Application Priority Data

Sep. 24, 1997 [JP] Japan .................................. 9-258122

[51] Int. Cl.$^7$ .................................................. H05K 3/30
[52] U.S. Cl. .................................................. 29/832
[58] Field of Search ........................... 29/833, 832, 740, 29/741

[56] References Cited

FOREIGN PATENT DOCUMENTS 63-308614 12/1988 Japan .
7/154085 6/1995 Japan .

*Primary Examiner*—Carl J. Arbes
*Attorney, Agent, or Firm*—Stevens, Davis, Miller & Mosher, L.L.P.

[57] ABSTRACT

There are disclosed an apparatus for and a method of mounting electronic parts, in which uniaxial tables for positioning a board can be driven at high speed, and the speed of mounting of the electronic parts on the board can be further increased. A natural vibration waveform A of uniaxial drive portions, constituting an X-Y table for positioning the board, is beforehand measured. When a deceleration portion of each of speed patterns V1 to V4 of the uniaxial tables, is synchronized with a minus portion of the natural vibration waveform, the vibration of the uniaxial tables is amplified to become vigorous. When the deceleration portion of the speed pattern is synchronized with a plus portion of the natural vibration waveform, the vibration of the uniaxial tables is absorbed to be suppressed. Therefore, the natural vibration waveform of the uniaxial tables is measured, and is stored in a natural vibration waveform storage portion, and the vibration of the uniaxial tables, developing when stopping the driving of the uniaxial tables, is so controlled that the deceleration portion of the speed pattern of the uniaxial tables can be synchronized with the plus portion of the natural vibration waveform.

5 Claims, 4 Drawing Sheets

APPARATUS FOR AND METHOD OF MOUNTING ELECTRONIC PARTS

BACKGROUND OF THE INVENTION

1. Field of the Invention

This invention relates to the art of mounting electronic parts on a board positioned on an X-Y table.

2. Related Art

In an electronic parts-mounting apparatus, transfer heads are indexably revolved around an axis of a rotary head, and an electronic part in a parts feeder is picked up by suction (vacuum) by a nozzle of each transfer head, and is transferred to and mounted on a board positioned on an X-Y table comprising uniaxial tables, and such apparatus has now been extensively used as a high-speed mounting apparatus.

In order that the electronic parts-mounting apparatus can mount the electronic parts at higher speed, it is necessary to provide some means for preventing or suppressing the vibrations of the uniaxial tables. More specifically, the uniaxial tables are driven to move the board horizontally in X- and Y-directions to a predetermined position, and then the driving of the uniaxial tables is stopped, thus completely stopping the board, and in this condition, the electronic parts are mounted on the board. In order to achieve the high-speed mounting of the electronic parts, the speed of driving of the uniaxial tables must be increased. However, if the driving speed of the uniaxial tables is increased, the vibration of the uniaxial tables becomes vigorous, and the board on the uniaxial tables also vibrates, so that the electronic parts can not be mounted in position on the board.

SUMMARY OF THE INVENTION

It is therefore an object of this invention to provide an apparatus for and a method of mounting electronic parts, in which uniaxial tables for positioning a board can be driven at high speed, and the speed of mounting of the electronic parts on the board can be further increased.

According to one aspect of the present invention, there is provided an electronic parts-mounting apparatus wherein transfer heads are indexably revolved around an axis of a rotary head, and an electronic part in parts feeder is held by suction and picked up by a nozzle, and is transferred to and mounted on a board positioned on an X-Y table comprising uniaxial tables, the apparatus comprising:

a natural vibration waveform storage portion for beforehand measuring a natural vibration waveform of the uniaxial tables and for storing the waveform;

a standard speed pattern-producing portion for producing speed patterns of acceleration and deceleration of the uniaxial tables;

a correction speed pattern-producing portion for producing correction speed patterns in accordance with the natural vibration waveform and the speed patterns, the correction speed patterns serving to suppress the vibration of the X-Y table when mounting the electronic part on the board; and a drive portion for driving the uniaxial tables in accordance with the correction speed pattern when mounting the electronic part on the board.

Preferably, there is provided an instruction portion for feeding to the standard speed pattern-producing portion an instruction regarding the distance of movement of the uniaxial tables.

According to another aspect of the invention, there is provided an electronic parts-mounting method wherein transfer heads are indexably revolved around an axis of a rotary head, and an electronic part in parts feeder is held by suction and picked up by a nozzle, and is transferred to and mounted on a board positioned on an X-Y table comprising uniaxial tables, the method comprising the steps of:

beforehand measuring a natural vibration waveform of the uniaxial tables, and storing the waveform in a natural vibration waveform storage portion; and setting speed patterns of the uniaxial tables in such a manner that a deceleration portion of the speed pattern is synchronized with a plus portion of the natural vibration waveform, whereby a vibrating force of the natural vibration and an accelerating force during the deceleration cancel each other, so that vibration of the uniaxial tables, developing when stopping the driving of the uniaxial tables, is suppressed, and in this condition the electronic part is mounted on the board on the X-Y table.

In this method, at the deceleration portion of the speed pattern, the plus vibrating force due to the natural vibration of the uniaxial tables and the minus accelerating force cancel each other, and therefore the vibration of the uniaxial tables, developing when stopping the movement of the board, can be suppressed, so that the electronic parts can be properly mounted on the board.

Preferably, the speed pattern is set in accordance with an instruction regarding the distance of movement of the uniaxial tables, which instruction is fed from an instruction portion.

According to a further aspect of the invention, there is provided an electronic parts-mounting method wherein transfer heads are indexably revolved around an axis of a rotary head, and an electronic part in parts feeder is held by suction and picked up by a nozzle, and is transferred to and mounted on a board positioned on an X-Y table comprising uniaxial tables, the method comprising the steps of:

beforehand measuring a natural vibration waveform of the uniaxial tables, and storing the waveform in a natural vibration waveform storage portion; and producing a correction speed pattern by a correction speed pattern-producing portion when each of the uniaxial tables is to stop at a vibration-amplifying point, determined in conjunction with the natural vibration waveform, so that the uniaxial table can be stopped at a vibration-absorbing point determined in conjunction with the natural vibration waveform, the uniaxial table being driven in accordance with the correction speed pattern, so that vibration of the uniaxial table, developing when stopping the driving of the uniaxial table, is suppressed, and in this condition the electronic part is mounted on the board on the X-Y table.

In this method, the uniaxial table is stopped at the vibration-absorbing point, and the vibration of the uniaxial table, developing when stopping the movement of the board, can be suppressed, so that the electronic parts can be properly mounted on the board.

Preferably, the correction speed pattern produces the correction speed pattern of the uniaxial tables in accordance with a speed pattern, fed from a standard speed pattern-producing portion, and the natural vibration waveform read from the natural vibration waveform storage portion.

DESCRIPTION OF THE PREFERRED EMBODIMENT

Figure 1:
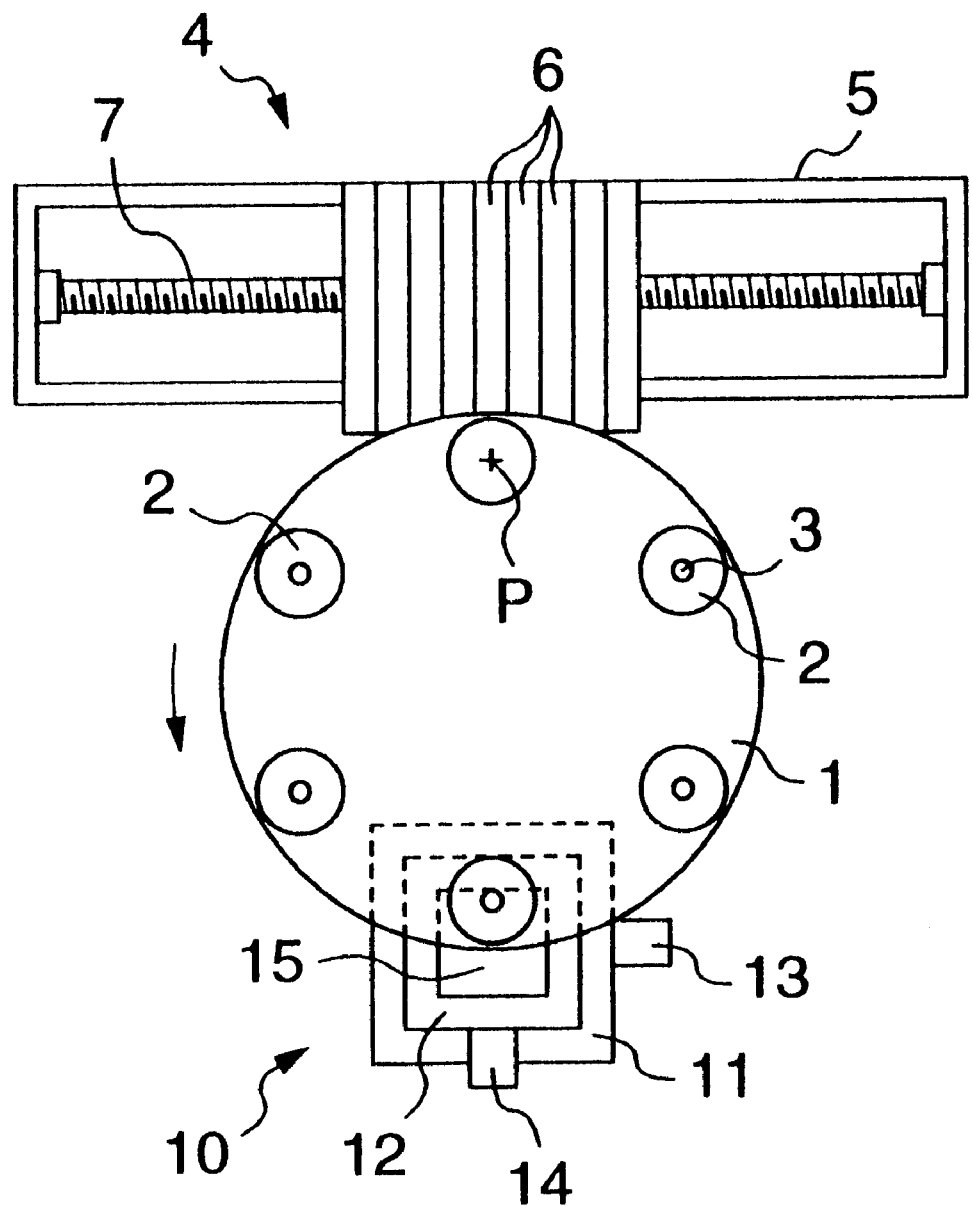
FIG. 1 is a plan view of one preferred embodiment of a rotary head-type electronic parts-mounting apparatus of the present invention.
Figure 3:
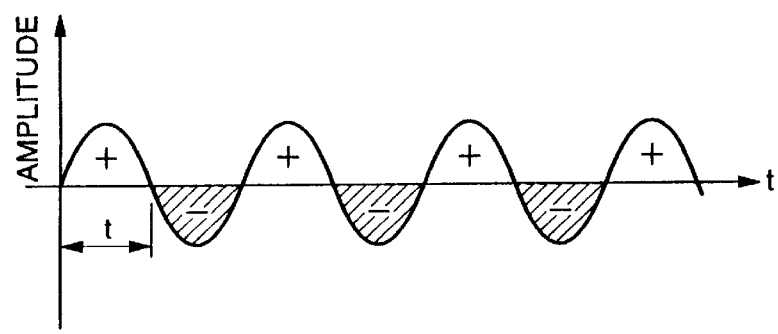
FIG. 3 is a diagram showing a waveform of natural vibration of the uniaxial tables.
Figure 4A:
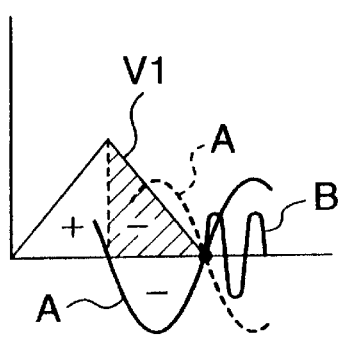
FIGS. 4A to 4D are diagrams showing speed patterns of the uniaxial tables of the apparatus.
Figure 4B:
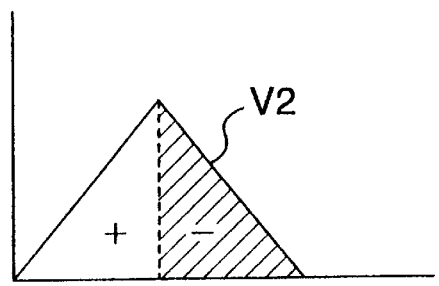
Figure 4C:
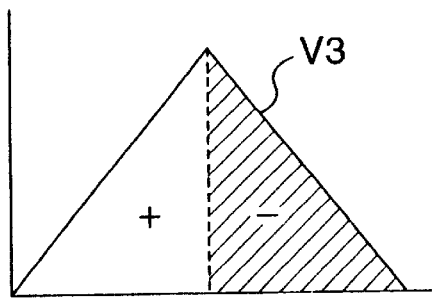
Figure 4D:
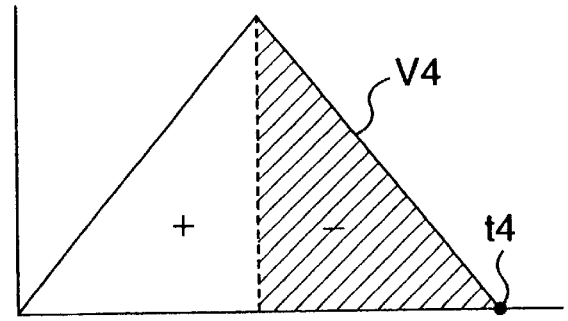
Figure 5:
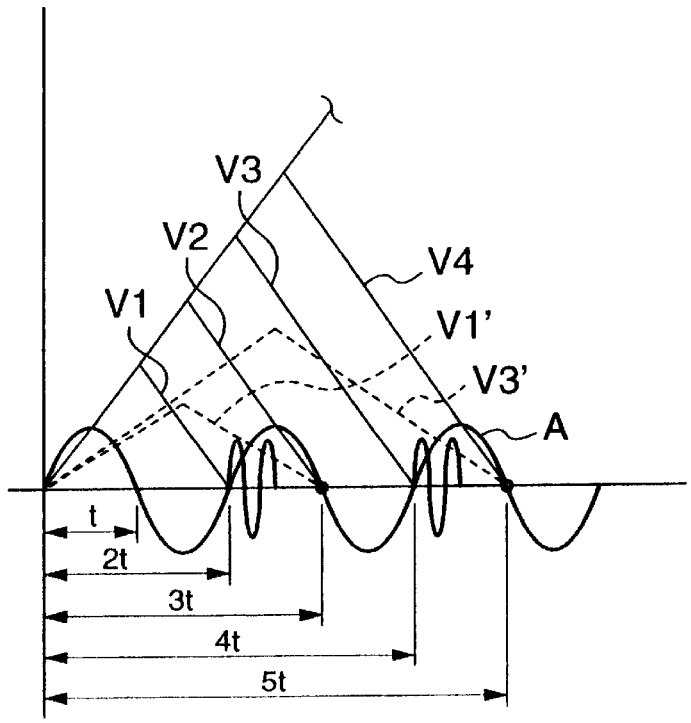
FIG. 5 is a diagram showing the superimposition of the speed patterns of the uniaxial tables on the natural vibration waveform thereof.
Figure 6:
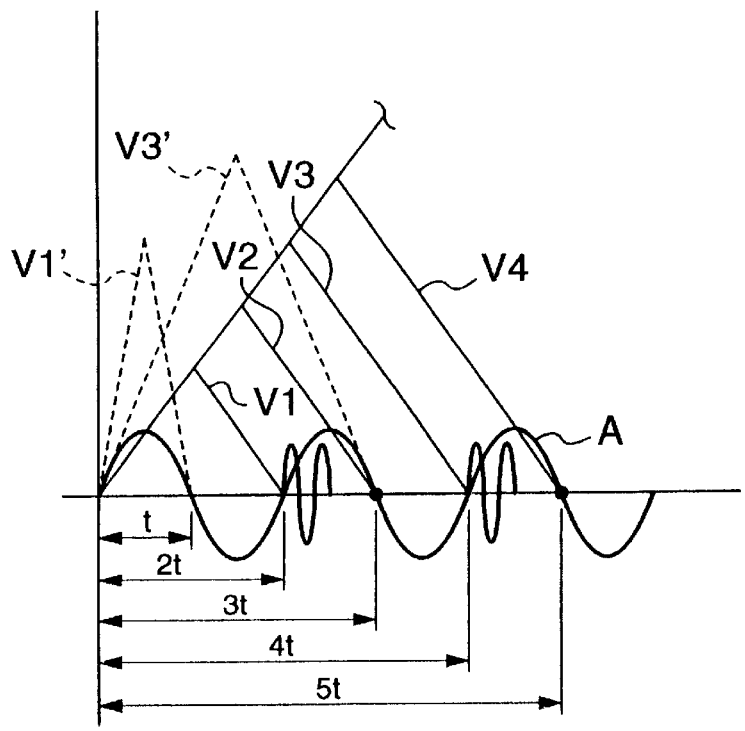
FIG. 6 is a diagram showing the superimposition of the speed patterns of the uniaxial tables on the natural vibration waveform thereof.

One preferred embodiment of the present invention will now be described with reference to the drawings. FIG. 1 is a plan view of one preferred embodiment of a rotary head-type electronic parts-mounting apparatus of the present invention, FIG. 2 is a block diagram of a control system for uniaxial tables of the apparatus, FIG. 3 is a diagram showing a waveform of natural vibration (oscillation) of the uniaxial tables, FIGS. 4A to 4D are diagrams showing speed patterns of the uniaxial tables, and FIGS. 5 and 6 are diagrams showing the superimposition of the speed patterns of the uniaxial tables on the natural vibration waveform thereof.

The overall construction of the rotary head-type electronic parts-mounting apparatus will first be described with reference to FIG. 1. Many transfer heads 2 are mounted on a rotary head 1. The transfer head 2 has a nozzle 3 for holding an electronic part by suction. An electronic parts supply portion 4 is provided at a rear side of the rotary head 1. The electronic parts supply portion 4 includes many parts feeders 6 mounted in a juxtaposed manner on a moving table 5, and the parts feeders 6 are moved laterally along a feed screw 7, and the required parts feeder 6, holding predetermined electronic parts, is moved to a suction-holding position (pick-up position) P where the nozzle 3 holds the electronic part by suction.

An X-Y table 10 is provided at a front side of the rotary head 1. The X-Y table 10 comprises uniaxial tables 11 and 12 stacked together, the table 11 being movable in an X-direction while the table 12 is movable in a Y-direction. The uniaxial tables 11 and 12 are driven by motors 13 and 14, respectively. Each of the uniaxial tables 11 and 12 includes a feed screw and a nut, and this feed screw is driven by the motor 13, 14. When the X-Y table 10 is driven, a board 15 on the X-Y table 10 is horizontally moved in the X-direction and the Y-direction, and is located in a predetermined position. The transfer heads 2 are indexably revolved around an axis of the rotary head 1, and the electronic part in the parts feeder 6 is held by suction and picked up by a lower end of the nozzle 3 at the pick-up position P, and is transferred to and mounted on the board 15 on the X-Y table 10. At this time, the X-Y table 10 is driven to move the board 15 in the X- and Y-directions so that each electronic part can be mounted at a predetermined coordinate position on the board 15.

Figure 2:
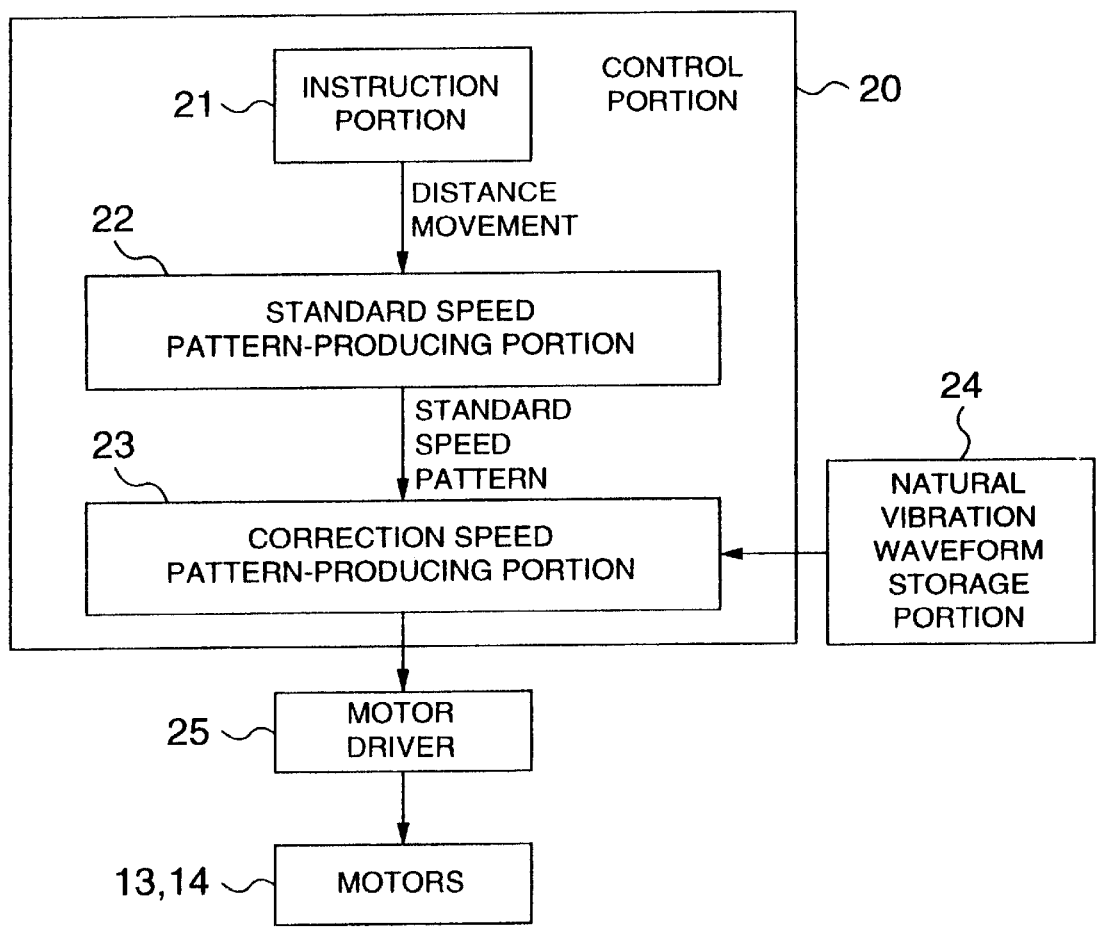
FIG. 2 is a block diagram of a control system for uniaxial table of the apparatus.

FIG. 2 is a block diagram of the control system for driving the uniaxial tables 11 and 12. A control portion 20 includes an instruction portion 21, a standard speed pattern-producing portion 22, and a correction speed pattern-producing portion 23. The instruction portion 21 feeds to the standard speed pattern-producing portion 22 an instruction regarding the distance of movement of the board 15 in the X- and Y- directions (that is, the amount of rotation of the motors 13 and 14). In accordance with the instruction from the instruction portion 21, the standard speed pattern-producing portion 22 produces speed patterns V1 to V4 (more fully described later) of acceleration and deceleration of the uniaxial tables 11 and 12, and feeds these speed patterns to the correction speed pattern-producing portion 23. The correction speed pattern-producing portion 23 reads the natural vibration waveform (see FIG. 3) of the uniaxial tables 11 and 12 from a natural vibration waveform storage portion 24, and corrects the standard speed pattern in accordance with the read natural vibration waveform to produce a correction speed pattern, and feeds this correction speed pattern to a motor driver 25. In accordance with the correction speed pattern, the motor driver 25 drives the motor 13, 14.

Next, the natural vibration waveform of the uniaxial tables 11 and 12 will be described. The uniaxial tables 11 and 12 produce their respective natural vibrations, depending on their constituent elements, assembling specification, and so on. FIG. 3 shows the natural vibration waveform A of the uniaxial tables 11 and 12. This natural vibration waveform A is obtained, for example, by applying vibrations to the uniaxial tables 11 and 12 and then by measuring a vibration mode by a laser, and the natural vibration waveform A is stored in the natural vibration waveform storage portion 24. As shown in the drawings, the vibration alternately goes high (plus (+)) and low (minus (−)). The time for a half of its cycle is represented by t.

FIG. 4 shows the speed patterns V1 to V4 of the uniaxial tables 11 and 12. These speed patterns V1 to V4 are produced in the standard speed pattern-producing portion 22. A left half of each of the speed patterns V1 to V4 is obtained during the acceleration while a right half (indicated by hatching) is obtained during the deceleration. A plus (+) accelerating force acts on the uniaxial tables 11 and 12 during the acceleration, and a minus (−) acceleration force acts on the uniaxial tables 11 and 12 during the deceleration. The speed patterns V1 to V4, shown respectively in FIGS. 4A to 4D, are increased in this order or sequence, and the larger the area of the speed pattern, the longer the distance of movement of the board 15.

Next, the superimposing characteristics of the natural vibration waveform and the speed patterns will be described with reference to FIG. 4A. In FIG. 4A, when the minus (−) portion of the natural vibration waveform A (indicated by a solid line) coincides with the minus (−) portion of the speed pattern, the minus vibrating force of the natural vibration waveform and the minus accelerating force are synchronized with each other when stopping the driving of the uniaxial tables 11 and 12 (that is, when stopping the movement of the board 15), and as a result the vibration is amplified, so that the uniaxial table 11, 12 is subjected to large vibration B. As described above, this vibration B adversely affects the accurate mounting of the electronic part on the board.

In FIG. 4A, when the plus (+) portion of the natural vibration waveform A (indicated by a broken line) coincides with the minus (−) portion of the speed pattern, the plus vibrating force of the natural vibration waveform and the minus accelerating force cancel each other, so that the vibration, developing on the uniaxial table 11, 12 is suppressed.

From the foregoing, it will be appreciated that if the deceleration portion of the speed pattern of the uniaxial table 11, 12 is synchronized with the plus (+) portion of the natural vibration waveform, vibrations, occurring when stopping the movement of the board 15, can be suppressed, so that the electronic part can be accurately mounted on the board 15. Therefore, the speed patterns of the uniaxial table 11, 12 are so determined that the deceleration portion of the speed pattern is synchronized with the plus (+) portion of the natural vibration waveform A.

FIG. 5 shows an example of the control. In FIG. 5, t, 3t, 5t . . . represent vibration-absorbing points (at which the deceleration portion of the speed pattern is synchronized with the plus portion of the natural vibration waveform, so that the vibration of the uniaxial table 11, 12 is suppressed, and therefore the electronic part can be properly mounted on the board 15). 2t, 4t . . . represent vibration-amplifying points (at which the deceleration portion of the speed pattern is synchronized with the minus portion of the natural vibration waveform, so that the vibration of the uniaxial table 11, 12 is increased, and therefore the electronic part can not be properly mounted on the board 15).

In FIG. 5, V2 and V4 cause the uniaxial table 11, 12 to stop at the vibration-absorbing points 3t and 5t, respectively, but V1 and V3 cause the table 11, 12 to stop at the vibration-amplifying points 2t and 4t, respectively. Therefore, the speed patterns V1 and V3 are so corrected (as indicated respectively by V1' and V3') as to cause the table 11, 12 to stop at the vibration-absorbing points 3t and 5t, respectively. Of course, the distance of movement by V1 and the distance of movement by V3 are equal respectively to the distance of movement by V1' and the distance of movement by V3'. These correction speed patterns V1' and V3' are produced in the correction pattern-producing portion 23, and the uniaxial table 11, 12 is controlled by these correction speed patterns V1' and V3'. By thus correcting the speed patterns, the driving of the uniaxial tables can be stopped at the vibration-absorbing point, thereby suppressing the vibration. Alternatively, the speed patterns V1 and V3 may be so corrected (as indicated respectively by V1' and V3' in FIG. 6 in which case the speed is increased) as to cause the table 11, 12 to stop at the vibration-absorbing points t and 3t, respectively. The speed patterns are so controlled that the electronic parts can be mounted on the board 15 at the vibration-absorbing points t, 3t, 5t . . . , and in this manner the mounting of the electronic parts on the board 15 is effected.

As described above, in the present invention, at the time of stopping the board, the vibrating force due to the natural vibration of the uniaxial table and the accelerating force during the deceleration cancel each other, and therefore the vibration at the time of stopping the movement of the board is suppressed, and the electronic parts can be properly mounted on the board. And besides, the driving of the uniaxial tables is stopped at the vibration-absorbing point, and by doing so, the vibration at the time of stopping the movement of the board can be suppressed, and the electronic parts can be properly mounted on the board.

What is claimed is:

1. An electronic parts-mounting method wherein transfer heads are indexably revolved around an axis of a rotary head, and an electronic part in a parts feeder is held by suction and picked up by a nozzle, and is transferred to and mounted on a board positioned on an X-Y table comprising uniaxial tables, said method comprising the steps of:

(a) providing a waveform value representing a natural vibration waveform of said uniaxial tables;

(b) storing said waveform value in a natural vibration storage portion;

(c) producing a standard speed pattern for driving said uniaxial tables a given distance;

(d) determining a vibration-absorbing point of said uniaxial tables in accordance with said waveform value and said standard speed pattern;

(e) producing a correction speed pattern for driving said uniaxial tables said given distance to stop at said vibration-absorbing point;

(f) driving said uniaxial tables in accordance with said correction speed pattern to suppress vibration of said uniaxial tables when said uniaxial tables are stopped;

(g) mounting the electronic part on said board on said X-Y table while said uniaxial tables are stopped at said vibration absorbing point.

2. A method according to claim 1, in which step (d) comprises comparing the waveform value provided in step (a) with the standard speed pattern produced in step (c).

3. An electronic parts-mounting method wherein transfer heads are indexably revolved around an axis of a rotary head, and an electronic part in a parts feeder is held by suction and picked up by a nozzle, and is transferred to and mounted on a board positioned on an X-Y table comprising uniaxial tables, said method comprising the steps of:

(a) providing a waveform value representing a natural vibration waveform of said uniaxial tables;

(b) storing said waveform value in a memory;

(c) setting a plurality of standard speed patterns for driving said uniaxial tables at respective given distances, each of said standard speed patterns corresponding to one of said given distances;

(d) determining vibration-absorbing points of said uniaxial tables in accordance with said waveform value and said standard speed patterns;

(e) producing correction speed patterns for driving said uniaxial tables said respective given distances to stop at respective ones of said vibration-absorbing points, each of said correction speed patterns corresponding to one of said given distances;

(f) selecting one of said given distances for moving said uniaxial tables;

(g) determining whether the one of said standard speed patterns which corresponds to said one of said distances stops said uniaxial tables at one of said vibration-absorbing points determined in step (d);

(h) if step (g) determines that the one of said standard speed patterns which corresponds to said one of said distances stops said uniaxial tables at one of said vibration-absorbing points, selecting said one of said standard speed patterns to drive said uniaxial tables said one of said given distances;

(i) if step (g) determines that the one of said standard speed patterns which corresponds to said one of said distances does not stop said uniaxial tables at one of said vibration-absorbing points, selecting the one of said correction speed patterns, which corresponds to said one of said given distances, to drive said uniaxial tables said one of said given distances;

(j) mounting the electronic part held by the nozzle of the rotary head when said uniaxial tables are stopped in accordance with step (h) or step (i) while said vibration is suppressed.

4. A method according to claim 3, wherein step (a) comprises applying vibrations to said uniaxial tables, and measuring the natural vibration waveform with a laser.

5. An electronic parts-mounting method wherein transfer heads are indexably revolved around an axis of a rotary head, and an electronic part in a parts feeder is held by suction and picked up by a nozzle, and is transferred to and mounted on a board positioned on an X-Y table comprising uniaxial tables, said method comprising the steps of:

(a) providing a waveform value representing a natural vibration waveform of said uniaxial tables;

(b) storing said waveform value in a memory;

(c) setting a plurality of standard speed patterns for driving said uniaxial tables at respective given distances, each of said standard speed patterns corresponding to one of said given distances;

(d) determining vibration-absorbing points of said uniaxial tables in accordance with said waveform value and said standard speed patterns;

(e) selecting one of said given distances for moving said uniaxial tables;

(f) determining whether the one of said standard speed patterns which corresponds to said one of said distances stops said uniaxial tables at one of said vibration-absorbing points determined in step (d);

(g) if step (f) determines that the one of said standard speed patterns which corresponds to said one of said distances stops said uniaxial tables at one of said vibration-absorbing points, selecting said one of said standard speed patterns to drive said uniaxial tables said one of said given distances;

(h) if step (f) determines that the one of said standard speed patterns which corresponds to said one of said distances does not stop said uniaxial tables at one of said vibration-absorbing points, producing a correction speed pattern for driving said uniaxial tables at said one of said given distances to drive said uniaxial tables said one of said given distances; and (i) mounting the electronic part held by the nozzle of the rotary head when said uniaxial tables are stopped in accordance with step (h) or step (i) while said vibration is suppressed.

* * * * *